(12) United States Patent
Suehiro et al.

(10) Patent No.: US 7,111,964 B2
(45) Date of Patent: Sep. 26, 2006

(54) LED PACKAGE

(75) Inventors: Yoshinobu Suehiro, Aichi-ken (JP);
Hideaki Kato, Aichi-ken (JP);
Mitsuhiro Inoue, Aichi-ken (JP)

(73) Assignee: Toyoda Gosei Co., Ltd.,
Nishikasugai-gun (JP)

( * ) Notice: Subject to any disclaimer, the term of this patent is extended or adjusted under 35 U.S.C. 154(b) by 204 days.

(21) Appl. No.: 10/798,885

(22) Filed: Mar. 12, 2004

(65) Prior Publication Data
US 2004/0207999 A1   Oct. 21, 2004

(30) Foreign Application Priority Data
Mar. 14, 2003   (JP) .............................. 2003-069289

(51) Int. Cl.
F21V 13/04 (2006.01)
H01L 33/00 (2006.01)

(52) U.S. Cl. ........................ 362/328; 362/308; 362/329; 362/800; 257/98

(58) Field of Classification Search ................ 362/257, 362/545, 328, 308, 329; 257/98
See application file for complete search history.

(56) References Cited

U.S. PATENT DOCUMENTS 5,452,190 A * 9/1995 Priesemuth ................ 362/255
6,345,903 B1 * 2/2002 Koike et al. ................ 362/249
6,755,556 B1 * 6/2004 Gasquet et al. ............. 362/329
6,896,381 B1 * 5/2005 Benitez et al. ............. 359/858

FOREIGN PATENT DOCUMENTS

| JP | 08-107235 | 4/1996 |
|---|---|---|
| JP | 2001-076513 | 3/2001 |
| JP | 2002-094129 | 3/2002 |
| JP | 2003-218408 | 7/2003 |

* cited by examiner

Primary Examiner—Alan Cariaso
Assistant Examiner—Leah S Lovell
(74) Attorney, Agent, or Firm—McGinn IP Law Group, PLLC

(57) ABSTRACT

An LED package has a light emitting element, a first optical section that is disposed around the light emitting element, and a second optical section that is disposed around the first optical while being separated from the first optical section. A gap is formed between the first and second optical sections. The gap allows part of light emitted from the light emitting element to be radiated from the first optical section as nearly parallel light converged in the direction perpendicular to the center axis of the light emitting element. The second optical section includes a reflection surface to reflect the nearly parallel light in the direction parallel to the center axis of the light emitting element.

17 Claims, 15 Drawing Sheets

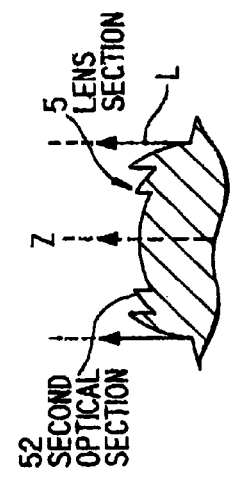
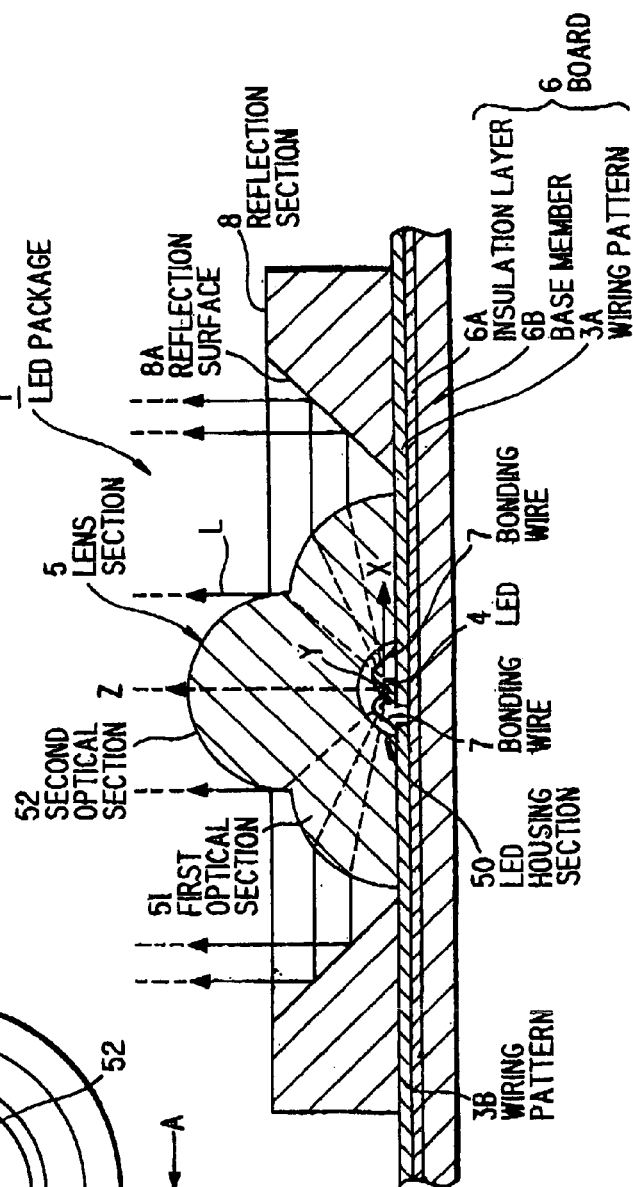
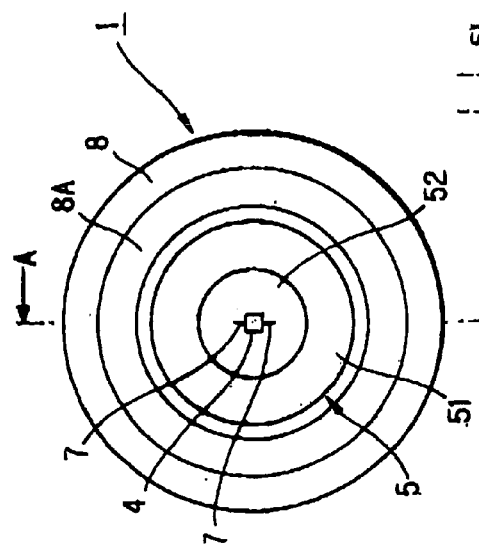

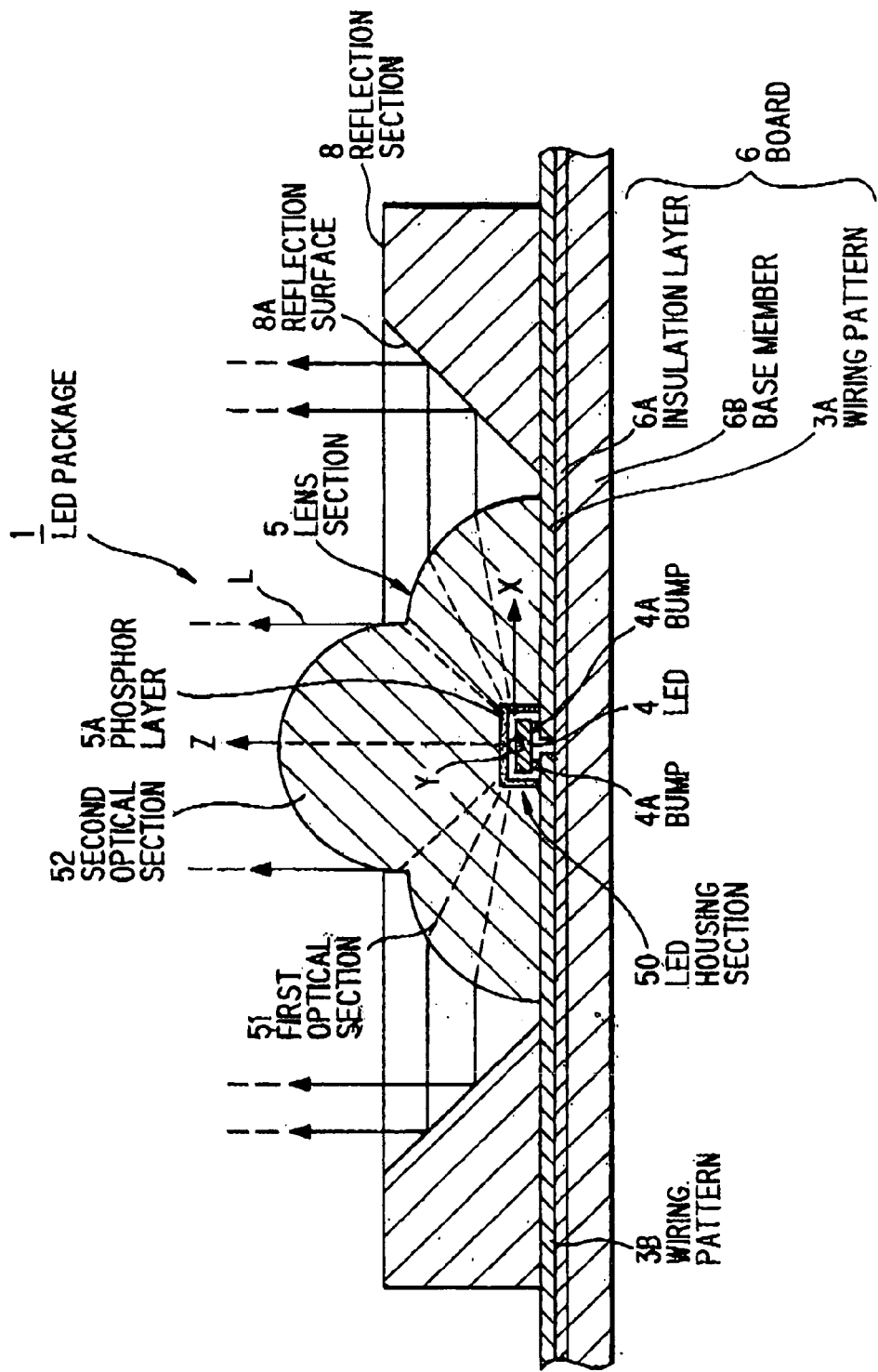

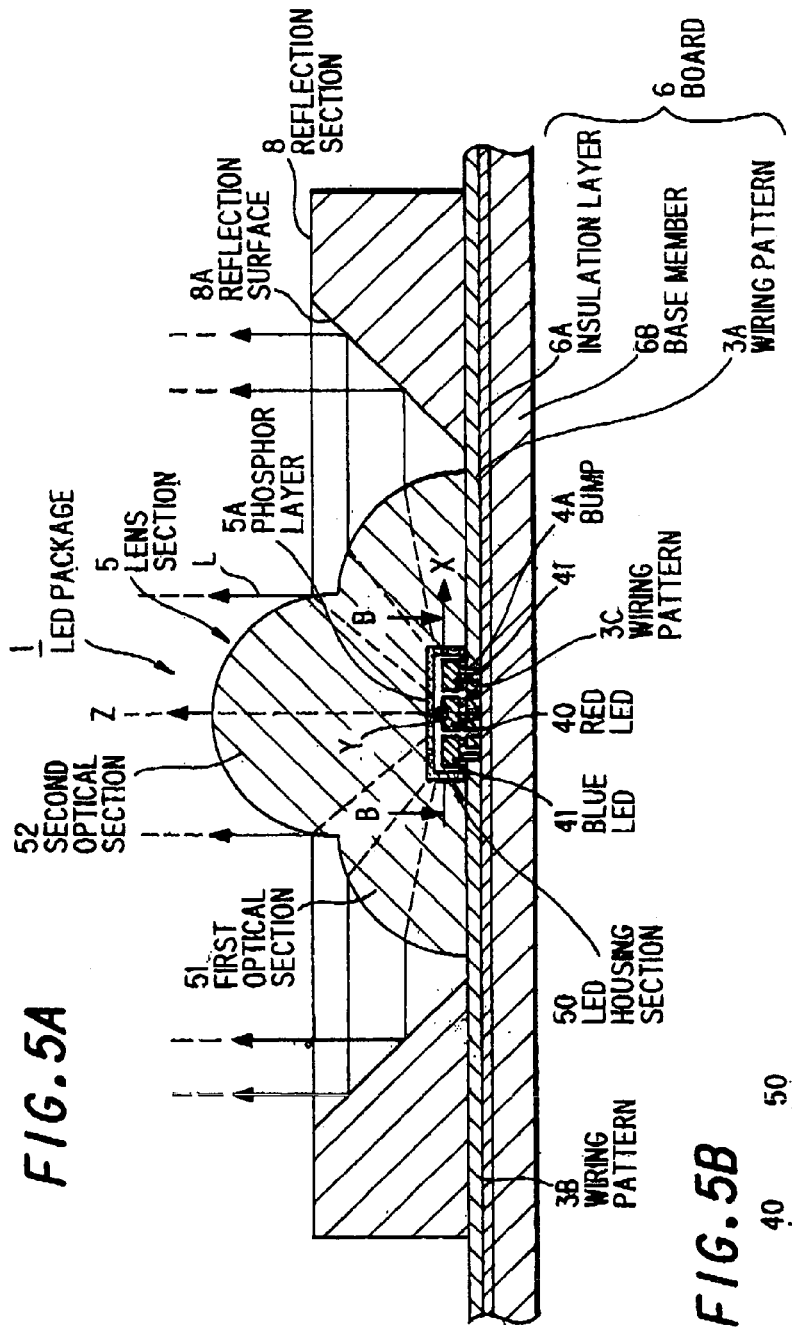
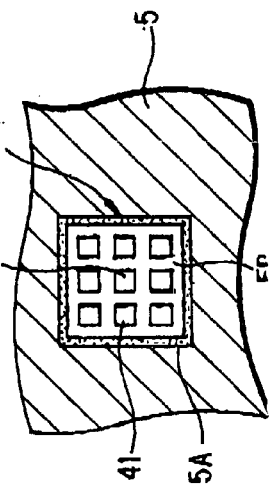
FIG. 5A
FIG. 5B

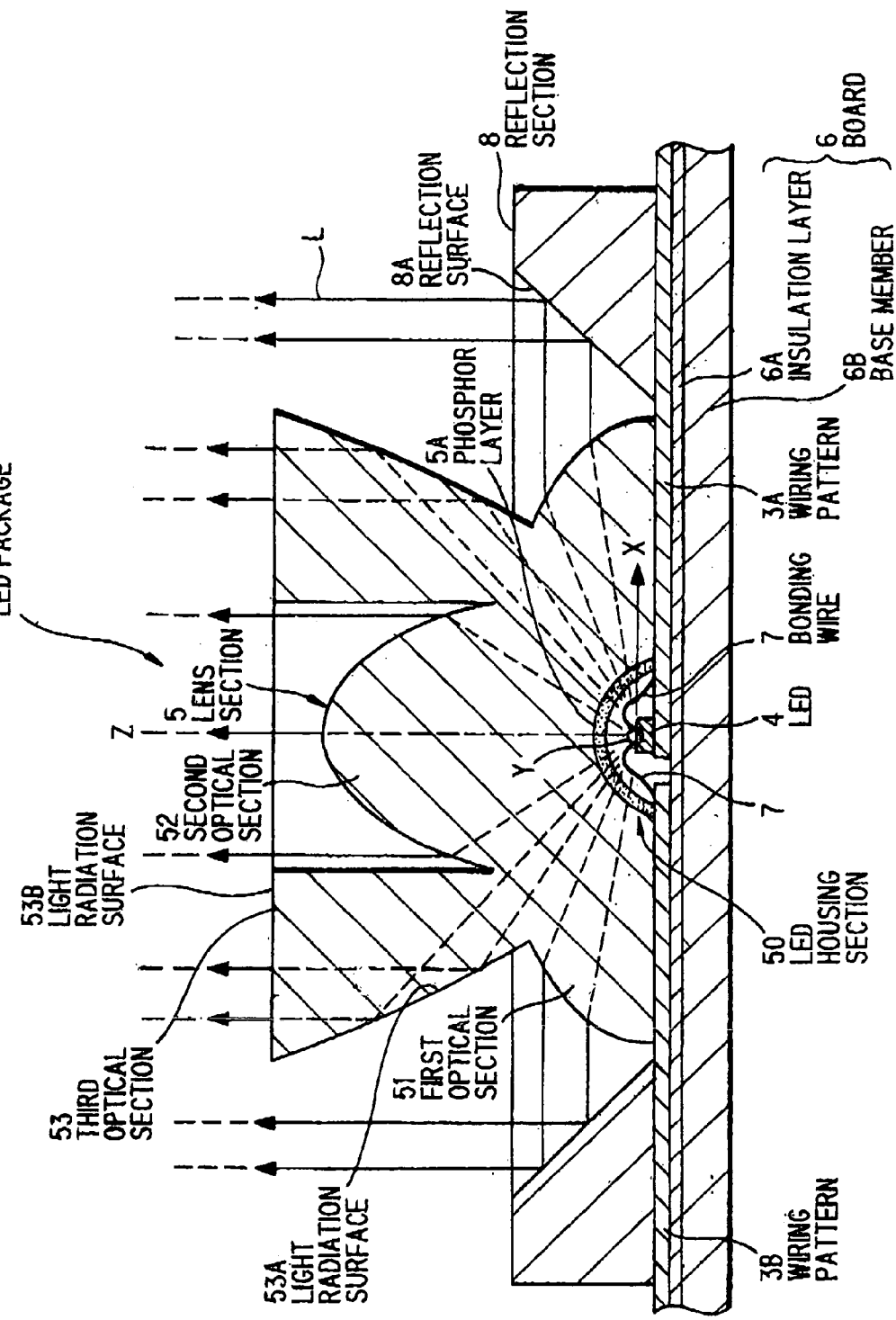

LED PACKAGE

The present application is based on Japanese patent application No. 2003-069289, the entire contents of which are incorporated herein by reference.

BACKGROUND OF THE INVENTION

1. Field of the Invention

The invention relates to an LED package and, particularly, to an LED package to radiate light emitted from a light emitting diode (hereinafter referred to as LED) through an optical system in a predetermined direction and range.

2. Description of the Related Art

Conventionally, a lens-type LED package is well known that uses a light emitting element as light source and is designed to radiate light emitted from the light emitting element in a predetermined direction while controlling its lighting distribution by using an optical system (e.g., Japanese patent application laid-open No.8-107235 (prior art 1)).

However, in the lens-type LED package, it is impossible to secure a sufficient solid angle of lens surface to the light emitting element when it is provided with an optical surface shape to enhance the convergence performance. Therefore, it can only control about 30% of light emitted from the light emitting element and, thus, cannot offer a high efficiency of external radiation. So, prior art 1 discloses an LED package that is provided with a reflection surface around the light emitting element.

FIG. 1 is a cross sectional view showing the LED package disclosed in prior art 1.

The LED package is composed of an LED 60 as light source and a lens 61 to radiate converging light L emitted from the LED 60.

The lens 61 has a cylindrical recess 61A formed at the center of a nearly truncated cone, a semispherical convex lens 61B provided in the recess 61A, a space 61D with a circular cross section formed at a minor bottom face 61C, and a reflection surface 61E to form its side face. The LED 60 is disposed at the center of space 61D.

In this LED package, light emitted from the LED 60 is radiated parallel to the center axis of lens 61 while being converged by the convex lens 61B. Also, light emitted in the direction of reflection surface 61E from the LED 60 is totally reflected on the reflection surface 61E and is then radiated parallel to the center axis of lens 61. Thus, since light emitted from the LED 60 is radiated parallel to the center axis of lens 61 based on total reflection and convergence, the lighting intensity at a point of equal distance can be increased.

However, the conventional LED package needs to use a large reflection mirror so as to efficiently control light not to be entered to the lens. Namely, as shown in FIG. 1, the reflection surface 61E needs to be further extended to a high level so as to efficiently control light not to be entered to the lens. A solid angle A of reflection surface 61A to the light emitting element 51 corresponding to that extension is big and the radiation intensity of light emitting element 51 is also intensive in this direction. Therefore, the amount of light to be controlled by the extension becomes considerable.

On the other hand, when using such a large reflection mirror, the diameter $D_L$ of lens to the outer diameter $D_W$ becomes relatively small. If the outer diameter $D_W$ is set small, then the homothetic ratio of lens diameter to emission area of light source has to be improper and, therefore, a problem is generated that, due to the lowering of convergence performance, it becomes impossible to radiate light with sufficient brightness in a desired direction and range. In addition, when the light source (LED) is enlarged according to the demand for high brightness or high output and its emission area is thereby enlarged, the homothetic ratio becomes improper. Thus, the same problem is generated.

Meanwhile, another LED package is suggested that uses a total reflection at its radiation surface to radiate light reflected on its reflection surface so as to offer a lower profile as well as enhancing the external radiation efficiency. However, in such an LED package, incident light to the reflection surface needs to have two optical paths and, therefore, a high convergence performance cannot be obtained.

SUMMARY OF THE INVENTION

It is an object of the invention to provide an LED package that offer an excellent convergence performance and radiation efficiency while being downsized and low-profiled.

According to the invention, an LED package comprises:
a light emitting element;
a first optical section that is disposed around the light emitting element;
a second optical section that is disposed around the first optical while being separated from the first optical section;
wherein a gap is formed between the first and second optical sections, the gap allows part of light emitted from the light emitting element to be radiated from the first optical section as nearly parallel light converged in the direction perpendicular to the center axis of the light emitting element, and the second optical section includes a reflection surface to reflect the nearly parallel light in the direction parallel to the center axis of the light emitting element.

BRIEF DESCRIPTION OF THE DRAWINGS

The preferred embodiments according to the invention will be explained below referring to the drawings, wherein:

FIG. 2A is a top view showing an LED package in a first preferred embodiment of the invention;

FIG. 2B is a cross sectional view cut along the line A—A in FIG. 2A;

FIG. 2C is a cross sectional view showing a modification of second optical section 52 in FIG. 2B;

FIG. 4 is a cross sectional view showing an LED package 1 in a third preferred embodiment of the invention;

FIG. 5A is a cross sectional view showing an LED package 1 in a fourth preferred embodiment of the invention;

FIG. 5B is a cross sectional view cut along the line B—B in FIG. 5A;

FIG. 13 is a cross sectional view showing an LED package 1 in a twelfth preferred embodiment of the invention;

DETAILED DESCRIPTION OF THE PREFERRED EMBODIMENTS

Figure 1:
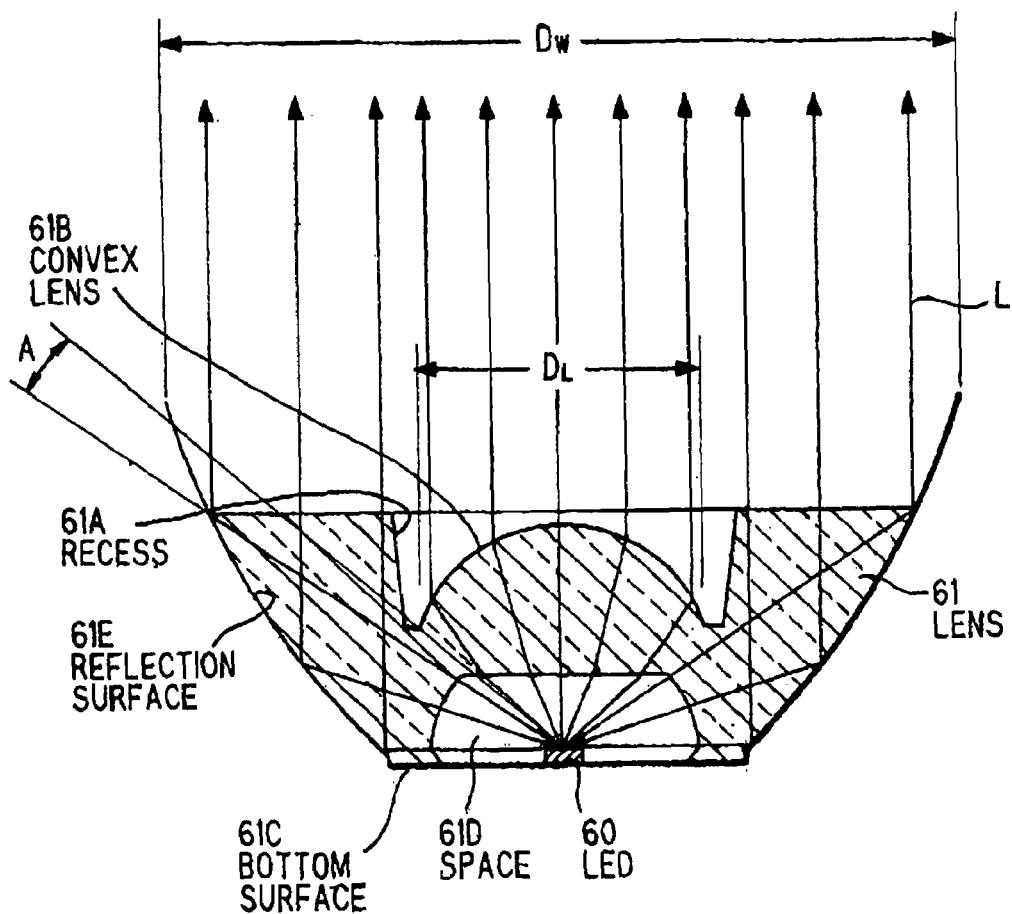
FIG. 1 is a cross sectional view showing the conventional LED package.

Herein, it is defined that the center axis of light emitting element is a Z-axis, a point on the upper surface of light emitting element to be crossed by the Z-axis is an origin point, and a coordinate system is provided with an X-axis and a Y-axis to intersect the Z-axis at the origin point. Z-axis is also referred to as center axis Z or optical axis Z.

Herein, a term "convergence (or converging)" means, including to converge light like a spot in the direction of Z-axis, to radiate light in the direction parallel to the Z-axis, to converge light in the direction perpendicular to the Z-axis, and to converge light in the direction of a predetermined angle to the Z-axis.

[First Embodiment]

FIG. 2A is a top view showing an LED package in the first preferred embodiment of the invention FIG. 2B is a cross sectional view cut along the line A—A in FIG. 2A. FIG. 2C is a cross sectional view showing a modification of second optical section 52 in FIG. 2B.

The LED package 1 is composed of: a board 6 that includes an insulation layer 6A, a base member 6B of an excellent thermal conductivity material such as aluminum etc., and wiring patterns 3A, 3B formed on the insulation layer 6A; an LED element 4 that is face-up bonded onto the wiring pattern 3A; bonding wires 7 that offer the electrical connection between the electrodes (not shown) of LED element 4 and the wiring patterns 3A, 3B; a lens section 5 that is bonded to the board 6 while surrounding the LED element 4 and bonding wires 7; and a reflection section 8 that is disposed around the lens section 5 while being ring-shaped.

The wiring patterns 3A, 3B are formed by etching a copper foil layer bonded through the insulation layer 6A onto the base member 6B to offer a predetermined circuit pattern. They are provided with a concave portion, which is formed by etching, to engage with a convex portion formed on the lens section 5.

The LED element 4 is of a gallium nitride system compound semiconductor such as GaN, GaAlN, InGaN, InGaAlN etc. or ZnSe and emits blue series light with a wavelength of 450 to 480 nm. The LED element 4 mainly emits light from its electrode forming surface and side face, and it has a chip size of 300×300 μm. The device structure of blue LED is well known and its explanation is omitted herein.

The lens section 5 is formed by injection-molding a transparent resin such as epoxy resin and polycarbonate resin with a good molding processability and transmittance. It is composed of: a first optical section 51 that is a nearly semispherical converging lens; a second optical section 52 that is a dome converging lens; a LED housing section 50 that is formed like a recess at the bottom of first optical section 51 to house the LED element 4 and bonding wires 7. The LED housing section 50 has such a shape and size that a gap between the LED housing section 50 and the LED element 4 can be minimized. In this embodiment, the lens section 5 has an outer diameter of 4.5 mm.

The first optical section 51 is disposed around the LED element 4 to refract light emitted from the LED element 4 in the nearly horizontal X-axis direction perpendicular to the optical axis Z. It has a convex curved surface that allows emitted light of about 45 to 90 degrees to the Z-axis to be radiated being refracted in the direction parallel to the X-axis. The convex curved surface is shaped by rotating around the Z-axis an ellipse that has a symmetrical axis on the X-axis, a distance D, from its origin point to elliptic center, a diameter $n*D_1$ in the X-axis direction, and a diameter $\sqrt{n^2-1}*D_1$ in the Z-axis direction. n is a refractive index of lens material. In case of epoxy resin and polycarbonate resin, n≅1.5. $D_1$ is an arbitrary value to determine a homothetic ratio.

The second optical section 52 is formed integrated with the first optical section 51 while protruding in the Z-axis to converge light emitted from the LED element 4 in the Z-axis direction. It has a convex curved surface that allows emitted light of up to about 45 degrees from the Z-axis to be radiated being converged in the Z-axis direction. The convex curved surface is shaped by rotating around the Z-axis an ellipse that has a symmetrical axis on the Z-axis, a distance $D_2$ from its origin point to elliptic center, a diameter $\sqrt{n^2-1}*D_2$ in the X-axis direction, and a diameter $n*D_2$ in the z-axis direction. $D_2$ is an arbitrary value to determine a homothetic ratio.

The lens section 5 is bonded positioned at a predetermined position to the board 6 on which the LED element 4 is mounted. Although not shown, the positioning is conducted such that the concave portions on the board 6 are engaged with the convex portions on the lens section 5. Alternatively, another positioning method may be used.

The reflection section 8 is formed by molding a resin such as transparent acrylic resin and polycarbonate and then depositing aluminum to provide a reflection surface 8A. alternatively, the reflection surface 8A may be provided by another film formation techniques such as sputtering and plating. As shown in FIG. 2B, the reflection surface 8A has an inclined angle of about 45 degrees to reflect light being radiated from the first optical section 51 in the Z-axis direction. The reflection section 8 may have a reflection-convergence characteristic by forming the reflection surface 8A to be curved while considering the radiation characteristic of first optical section 51. In this embodiment, the reflection section 8 has an outer diameter of 7.5 mm. The reflection section 8 may be of another resin material with a good molding processability, such as epoxy resin and ultraviolet curing resin.

In manufacturing the LED package 1, the board 6 with a copper foil layer formed on the surface is etched to form the wiring patterns 3A, 3B. Then, the LED element 4 is face-up bonded onto the surface of wiring pattern 3A. Then, the electrodes (nor shown) of LED element 4 are electrically connected through the bonding wires 7 to the wiring patterns 3A, 3B.

The lens section 5 and reflection section 8 are made in separate process. First, by filling transparent resin in a mold with such a lens shape, the lens section 5 with the LED housing section 50 having a cross section as shown in FIG.

2B is made by injection-molding. In process of injection molding, the concave portions for positioning are simultaneously molded.

Then, by filling acrylic resin in a mold with a predetermined shape, the reflection section 8 having a cross section as shown in FIG. 2B is made by injection-molding. In process of injection molding, the concave portions for positioning as provided with the lens section 5 may be simultaneously molded.

Then, the lens section 5 is positioned such that its convex portions are engaged with the concave portions on the wiring patterns 3A, 3B. At that time, the LED housing section 50 is filled with transparent silicon resin injected thereinto. Then, the lens section 5 is fixed on the wiring patterns 3A, 3B while sealing the LED element 4 with silicon resin.

Then, the reflection section 5 is positioned at a predetermined position around the lens section 5. Meanwhile, the reflection section 8 may be bonded onto the board 6 before bonding the lens section 5 onto the board 6.

The operation of the LED package 1 of the first embodiment will be described below.

A drive section (not shown) applies a drive voltage to the wiring patterns 3A, 3B. The LED element 4 emits blue light based on the drive voltage. Of blue light emitted from the LED element 4, light in a range of about 45 degrees from the Z-axis is radiated in the direction parallel to the Z-axis while being converged by the second optical section 52. On the other, light thereof in a range of about 45 to 90 degrees to the Z-axis is radiated in the direction perpendicular to the Z-axis while being refracted by the first optical section 51. Thus, nearly all lights emitted from the LED element 4 are radiated in the Z-axis direction or in the direction perpendicular to the Z-axis. Light being radiated in the direction perpendicular to the Z-axis is then externally radiated in the direction parallel to the Z-axis while being reflected by the reflection surface 8A.

The effects obtained in the first embodiment are as follows.

(1) The light utilization efficiency is enhanced to increase the brightness since all the amount of light emitted from the LED element 4 is controlled by the lens section 5 composed of the first optical section 51 to converge emitted light in the X-axis direction perpendicular to the Z-axis and the second optical section 52 to converge emitted light in the Z-axis direction.

(2) Since the light utilization efficiency is enhanced without enlarging the reflection surface 8A, the entire package is low-profiled (thin-shaped).

(3) Since the reflection surface 8A is not so large and, therefore, a sufficient lens diameter to the whole diameter can be secured, a lowering in convergence characteristic due to the size of light source can be prevented even when the whole diameter is reduced or even when the size of LED element is enlarged.

(4) Since the lens section 5 is provided as an external attachment, a difficulty in molding such as a crack due to a thermal stress generated in sealing the LED element 4 with resin can be avoided. Thereby, its productivity can be improved. Further, the degree of freedom in molding can be enhanced since a suitable material to the molding processability and transparency can be chosen regardless of the adhesiveness to board 6.

(5) Since the externally attached lens section 5 is positioned to the wiring patterns 3A, 3B, the LED element 4 can be disposed in a suitable positional relationship with the lens section 5 Unevenness in light radiation depending on direction can be prevented, and light can be evenly radiated in a desired radiation direction. The lens section 5 can have optionally a shape according to use.

(6) The apparent emission area of package itself can be increased by disposing the reflection surface 8A further outside (by increasing the diameter of reflection surface 8A as partial shape of cone). Even when thus composed, the high light utilization efficiency can be maintained while keeping the package low-profiled.

Although in the first embodiment the LED element 4 to radiate blue light is used, the LED element 4 to radiate red, green or ultraviolet light other than blue light may be used.

The lens section 5 is not limited to such a transparent lens and may be colored or may include a phosphor to radiate excited light while being excited by blue light or a light diffusion agent.

The LED element 4 may be a large chip (e.g., 1000×1000 μm) of high-output type.

The second optical section 52 may be, as shown in FIG. 2C, shaped like a Fresnel lens to provide a further low profile

[Second Embodiment]

Figure 3:
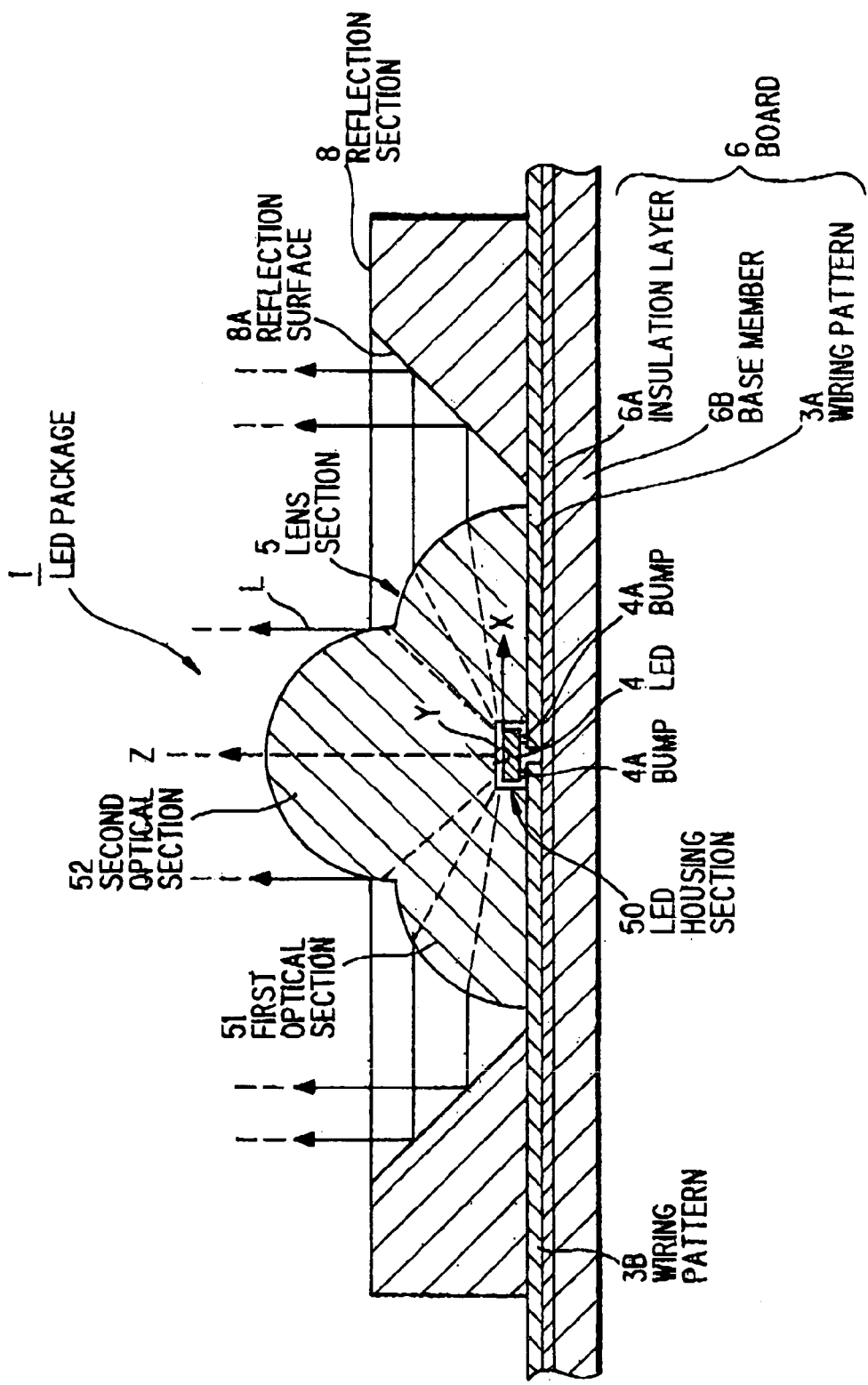
FIG. 3 is a cross sectional view showing an LED package 1 in a second preferred embodiment of the invention.

FIG. 3 is a cross sectional view showing an LED package 1 in the second preferred embodiment of the invention. Like components are indicated by the same numerals used in the first embodiment and the explanations thereof are omitted below.

The LED package 1 of the first embodiment is different from that of the first embodiment in that it is composed of a large-chip LED element 4 of 1000×1000 μm and a lens section 5 with an LED housing section 50 whose shape is formed so as to minimize a gap between the lens section 5 and the LED element 4.

The LED element 4 is flip-chip bonded through bumps 4A onto the wiring patterns 3A, 3B. The LED element 4 is integrally sealed with silicon resin to be injected into the LED housing section 50.

In the second embodiment, adding to the effects of the first embodiment, even light emitted from such a large-size LED element 4 can be efficiently radiated in the Z-axis and X-axis directions by using the first and second optical sections. Therefore, this embodiment can be sufficiently applied to a high-brightness and high-output LED package.

Also, the structure of this embodiment can be applied to a wavelength-converting LED package that white light is obtained mixing blue light and yellow light by disposing around the LED element 4 a yellow phosphor to radiate yellow light while being excited by blue light emitted from the LED element 4

[Third Embodiment]

FIG. 4 is a cross sectional view showing an LED package 1 in the third preferred embodiment of the invention.

The LED package 1 of this embodiment is, different from that of the second embodiment, composed of an LED element 4 that is a large chip of 1000×1000 μm, and a lens section 5 with phosphor layer 5A that is thinly formed on the surface of LED housing section 50 and with a yellow phosphor.

The phosphor layer 5A is of Ce:YAG (yttrium aluminum garnet) to radiate yellow light while being excited by blue light emitted from the LED element 4. Yellow light thus radiated is mixed with blue light to generate white light.

In the third embodiment, adding to the effects of the first and second embodiments, due to the phosphor layer 5A thinly formed on the surface of LED housing section 50, the enlargement of light source size can be prevented even when using a large-chip LED element 4. Thereby, since a homothetic ratio between the LED element 4 and the second optical section 52 can be secured, light in the Z-axis direction can be converged like a spot without increasing the convergence diameter. Also, since a homothetic ratio between the LED element 4 and the first optical section 51 can be secured, the lowering of radiation characteristic in the X-axis direction can be prevented.

[Fourth Embodiment]

FIG. 5A is a cross sectional view showing an LED package 1 in the fourth preferred embodiment of the invention. FIG. 5B is a cross sectional view cut along the line B—B in FIG. 5A.

The LED package 1 of this embodiment is composed of: a board 6 with wiring patterns 3A, 3B and 3C formed on the surface of insulation layer 6A; red LED element 40 and blue LED elements 41 that are flip-chip bonded onto the wiring patterns 3A, 3B and 3C while being disposed in a predetermined arrangement; and LED housing section 50 that houses the red LED element 40 and blue LED elements 41 while providing them with sealing.

The eight blue LED elements 41 are, as shown in FIG. 5B, disposed around the red LED element 40. The LED elements 40, 41 each have a chip size of 300×300 μm.

The LED housing section 50 has such a shape and size that can minimize a gap formed between the LED element 4 and itself as far as possible. It is provided, on its surface, with the phosphor layer 5A that is of Ce:YAG to be excited by blue light radiated from the blue LED element 41 and thereby to radiate yellow light.

In the fourth embodiment, adding to the effects of the first and third embodiments, white light with a high color rendering property can be obtained since red light radiated from the red LED element 40 is added to white light that is obtained by mixing blue light radiated from the blue LED element 41 with yellow light radiated from the phosphor layer 5A to be excited by that blue light.

[Fifth Embodiment]

Figure 6:
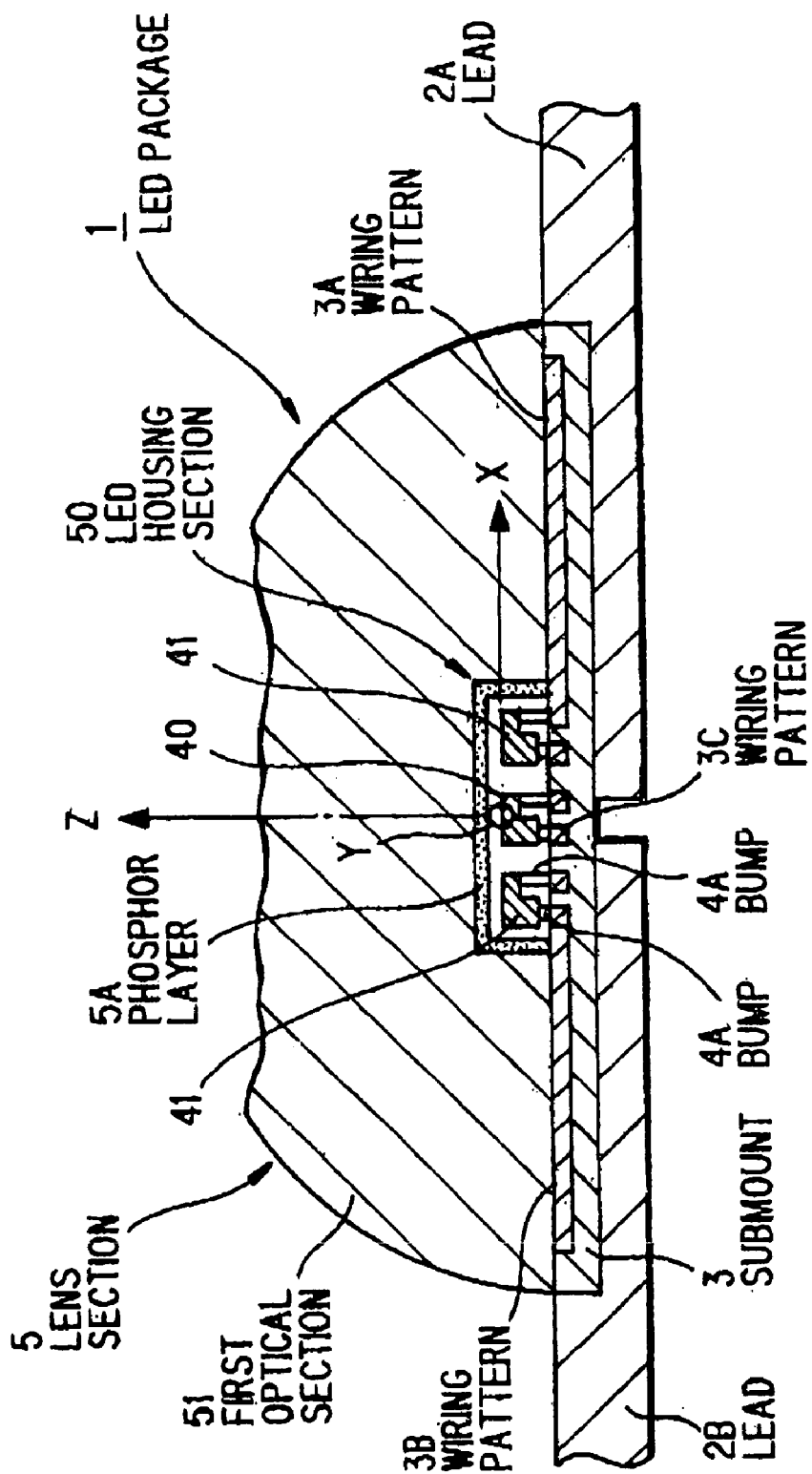
FIG. 6 is a cross sectional view showing part of an LED package 1 in a fifth preferred embodiment of the invention.

FIG. 6 is a cross sectional view showing part of an LED package 1 in the fifth preferred embodiment of the invention.

The LED package 1 of this embodiment is, different from that of the fourth embodiment, composed of: leads 2A, 2B that are of conductive material such as copper alloy and serve as a power supplying portion; a submount 3 that is provided on the LED-mounting side of leads 2A, 2B and has wiring patterns 3A, 3B, and 3C provided on its surface; and red LED element 40 and blue LED elements 41 that are flip-chip mounted through bumps 4A onto the wiring patterns 3A, 3B and 3C.

The submount 3 is of a material with high thermal conductivity, such as AlN. The red LED element 40 and blue LED elements 41 are flip-chip bonded through the bumps 4A onto the copper-foil wiring patterns 3A, 3B and 3C formed on the submount 3. The wiring patterns 3A, 3B and 3C are electrically connected through a viahole (not shown) to the leads 2A, 2B.

In the fifth embodiment, since the red LED element 40 and blue LED elements 41 are mounted on the wiring patterns 3A, 3B and 3C formed on the submount 3, heat generated when the red LED element 40 and blue LED elements 41 are turned on can be rapidly and efficiently conducted to the leads 2A, 2B. Also, due to the thermal stress thus reduced, this embodiment can be sufficiently applied to a high-brightness and high-output LED package. Thus, since a thermal shrinkage in the LED housing section 50 is prevented, stable operation and high reliability can be obtained.

[Sixth Embodiment]

Figure 7:
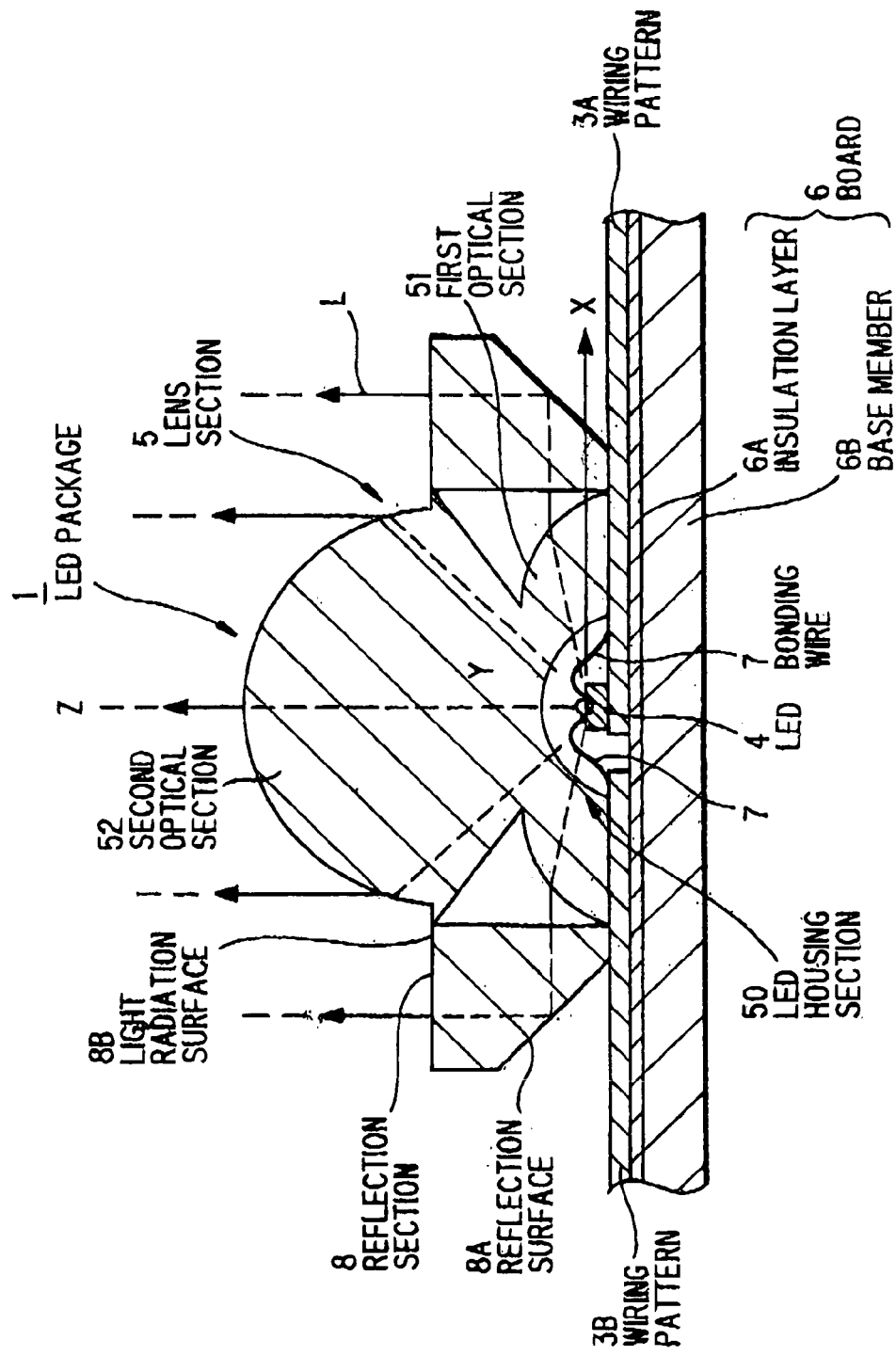
FIG. 7 is a cross sectional view showing an LED package 1 in a sixth preferred embodiment of the invention.

FIG. 7 is a cross sectional view showing an LED package 1 in the sixth preferred embodiment of the invention.

The LED package 1 of this embodiment is, different from that of the first embodiment, composed of a lens section 5 that the first optical section 51 has an outer diameter nearly equal to that of the second optical section 52; and a reflection section 8 that is ring-shaped and disposed around the lens section 5.

The reflection section 8 is made by molding a transparent resin with a relatively high refractive index such as polycarbonate with refractive index of 1.5. It is composed of a reflection surface 8A that reflects light being entered from the first optical section 51 by total reflection of resin interface and then radiates it in the Z-axis direction, and a radiation surface 8B that radiates reflected light outside the package. The reflection surface 8A is provided with an inclined angle of about 45 degrees.

In the sixth embodiment, adding to the effects of the first embodiment, the entire optical system including the reflection section 9 can be downsized. Since the mirroring process of reflection section 8, such as deposition, can be eliminated, the mass productivity can be enhanced. The convergence of second optical section 52 may be conducted such that nearly parallel light is radiated in an angle range of 60 to 90 degrees to the Z-axis. In this case, the normal-line direction of reflection surface 8A only has to define an increased angle to the Z-axis and, therefore, the diameter of reflection surface 8A can be reduced without changing the diameter of first optical section 51 and second optical section 52. Thus, the characteristics of the sixth embodiment can be obtained while reducing the outer diameter.

[Seventh Embodiment]

Figure 8:
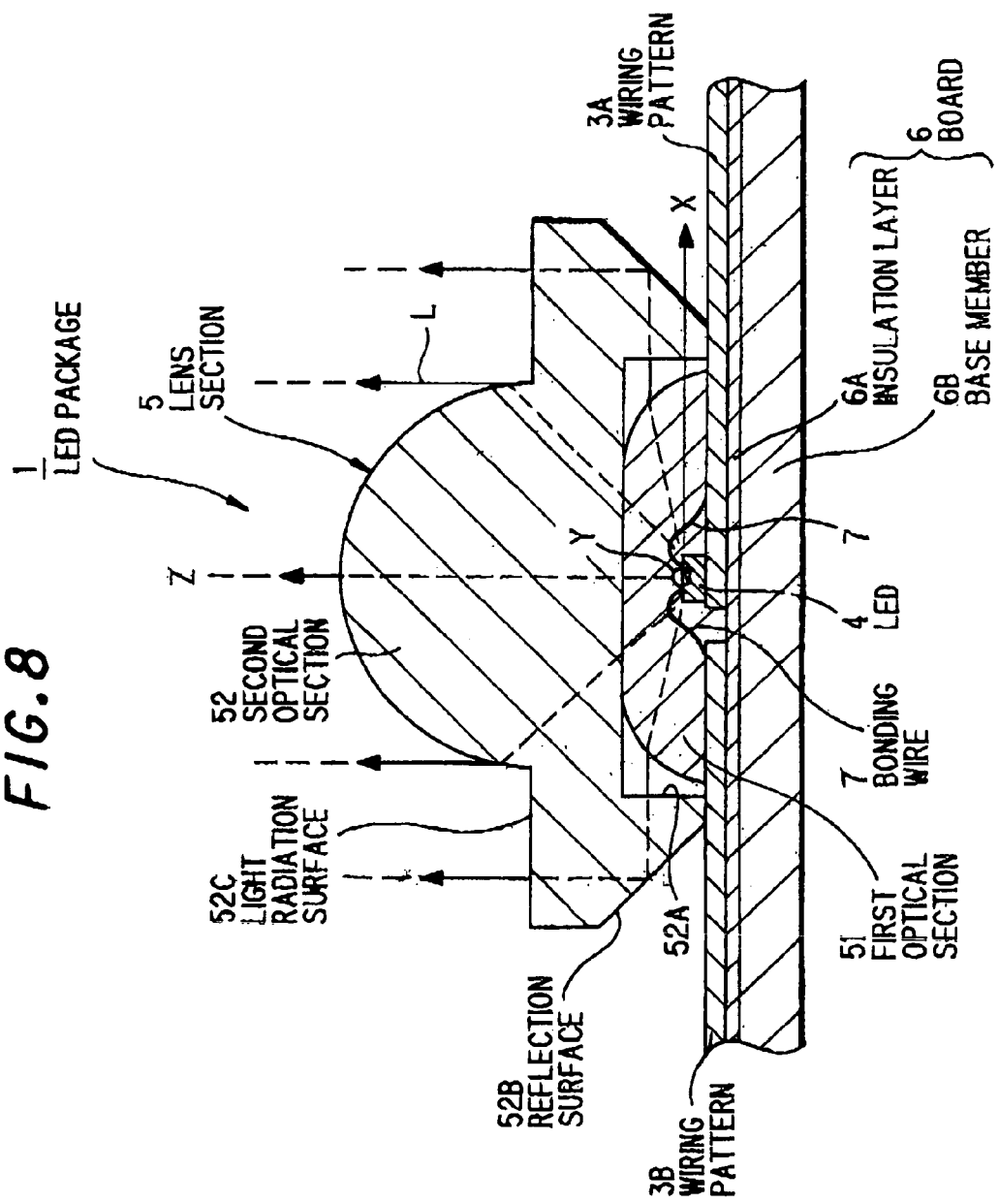
FIG. 8 is a cross sectional view showing an LED package 1 in a seventh preferred embodiment of the invention.

FIG. 8 is a cross sectional view showing an LED package 1 in the seventh preferred embodiment of the invention.

The LED package 1 of this embodiment has, different from that of the first embodiment, a lens section 5 that is composed of a first optical section 51 that is of transparent resin and integrally seals the LED element 4 and bonding wires 7, and a second optical section 52 that is of transparent resin and houses the first optical section 51 at its bottom to radiate light emitted from the LED element 4 in the Z-axis direction based on its convergence and reflection.

The first optical section 51 is formed by molding epoxy resin such that it has a low-profiled shape with a flat face on its top and a curved face on its side as shown in FIG. 8.

In the seventh embodiment, light emitted from the LED element 4 in a range of less than about 45 degrees to the Z-axis is irradiated to the top face of first optical section 51. Then, light goes straight, almost, without being refracted at their boundary since the bottom face of second optical section 52 contacting the top face of first optical section 51 is flat and there is substantially no gap therebetween, irradiated to the lens face of second optical section 52, radiated outside the package in the direction parallel to the Z-axis.

Meanwhile, light emitted from the LED element 4 in a range of less than about 35 degrees to the Z-axis has a big interface reflection loss at the boundary of the first optical section 51 and second optical section 52. Therefore, it is desirable that the interface reflection loss is reduced by eliminating the air layer through an optical adhesive provided therebetween.

On the other hand, light emitted from the LED element 4 in a range of greater than about 45 degrees to the Z-axis is radiated refracted by the side lens of first optical section 51 in the direction perpendicular to the Z-axis, entered perpendicularly to the incident surface 52A of second optical section 52, reflected on a reflection surface 52B in the direction parallel to the Z-axis, entered perpendicularly to a light radiation surface 52C, radiated outside the package in the direction parallel to the Z-axis.

In the seventh embodiment, adding to the effects of the first embodiment, since the second optical section 52 is provided with the reflection face 52B and light radiation surface 52C to be formed integrally, the first optical section 51 is not needed to be made in separate process and, therefore, the manufacturing process be simplified and the positioning precision therebetween can be enhanced. Thereby, the convergence/reflection characteristics in the Z-axis direction can be enhanced. Further, the first optical section 51 can be further downsized since there is not the limitation that the thickness needs to be secured in making it in separate process.

[Eighth Embodiment]

Figure 9:
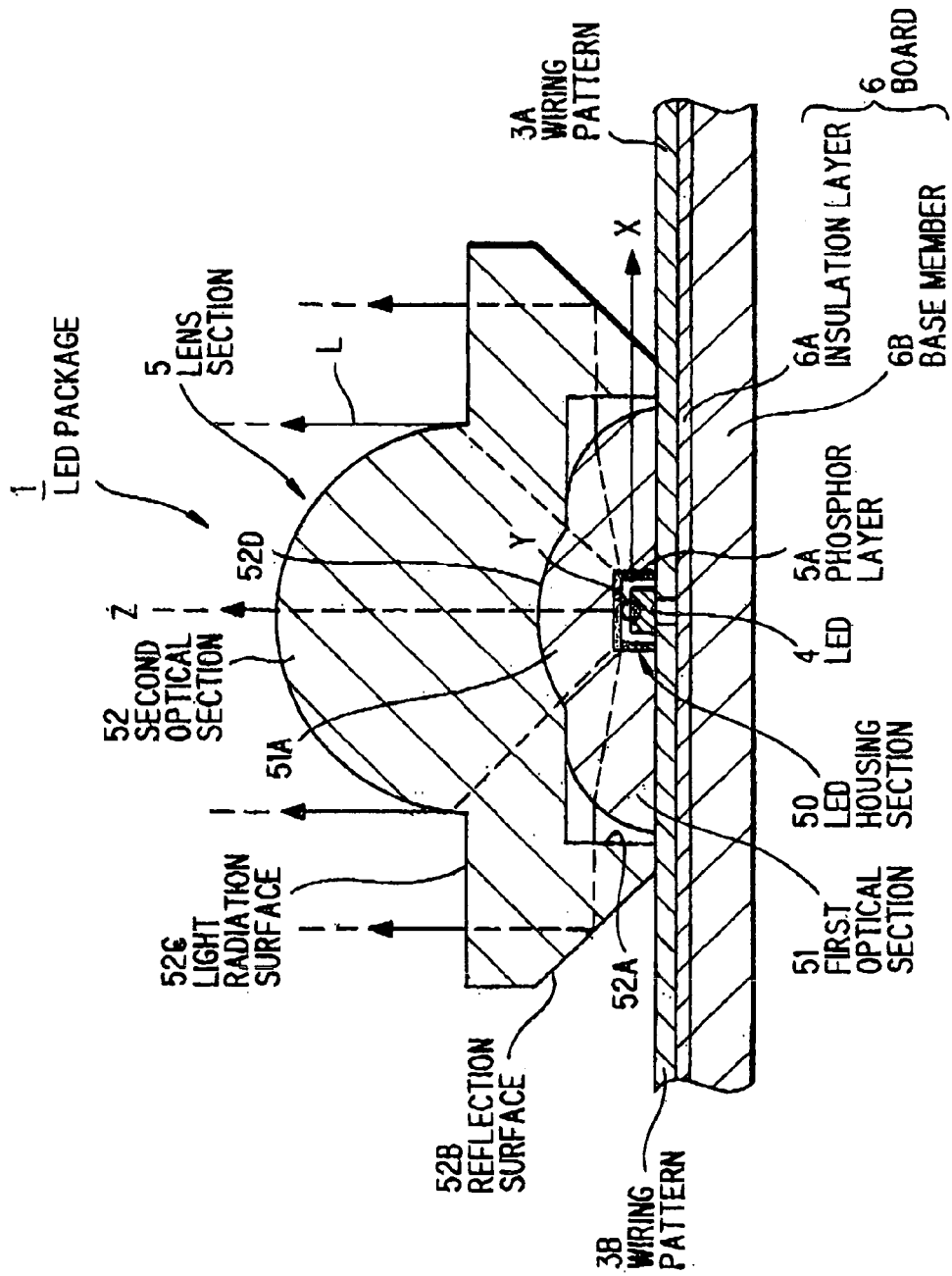
FIG. 9 is a cross sectional view showing an LED package 1 in an eighth preferred embodiment of the invention.

FIG. 9 is a cross sectional view showing an LED package 1 in the eighth preferred embodiment of the invention The LED package 1 of this embodiment is, different from that of the seventh embodiment, composed of: a flip-chip type LED element 4; a first optical section 51 that is of transparent resin and has a LED housing section 50 to house the LED element 4 with a gap; and a phosphor layer 5A that is of yellow phosphor and is thinly formed along the surface of the LED housing section 50; wherein the first optical section 51 is provided with a radiation surface 51A to be formed spherical based on the origin point of coordinate, the center of light emission surface of LED element 4, and the second optical section 52 is provided 15 with an incident surface 52D shaped along the shape of radiation surface 8A in its opening 52A.

In the eighth embodiment, adding to the effects of the seventh embodiment, the phosphor layer 5A can be thinly formed and thereby the enlargement of light source size can be prevented. Further, since no wire space is needed, the phosphor layer 5A can be disposed further close to the LED element 4 and thereby the convergence characteristic can be enhanced.

[Ninth Embodiment]

Figure 10:
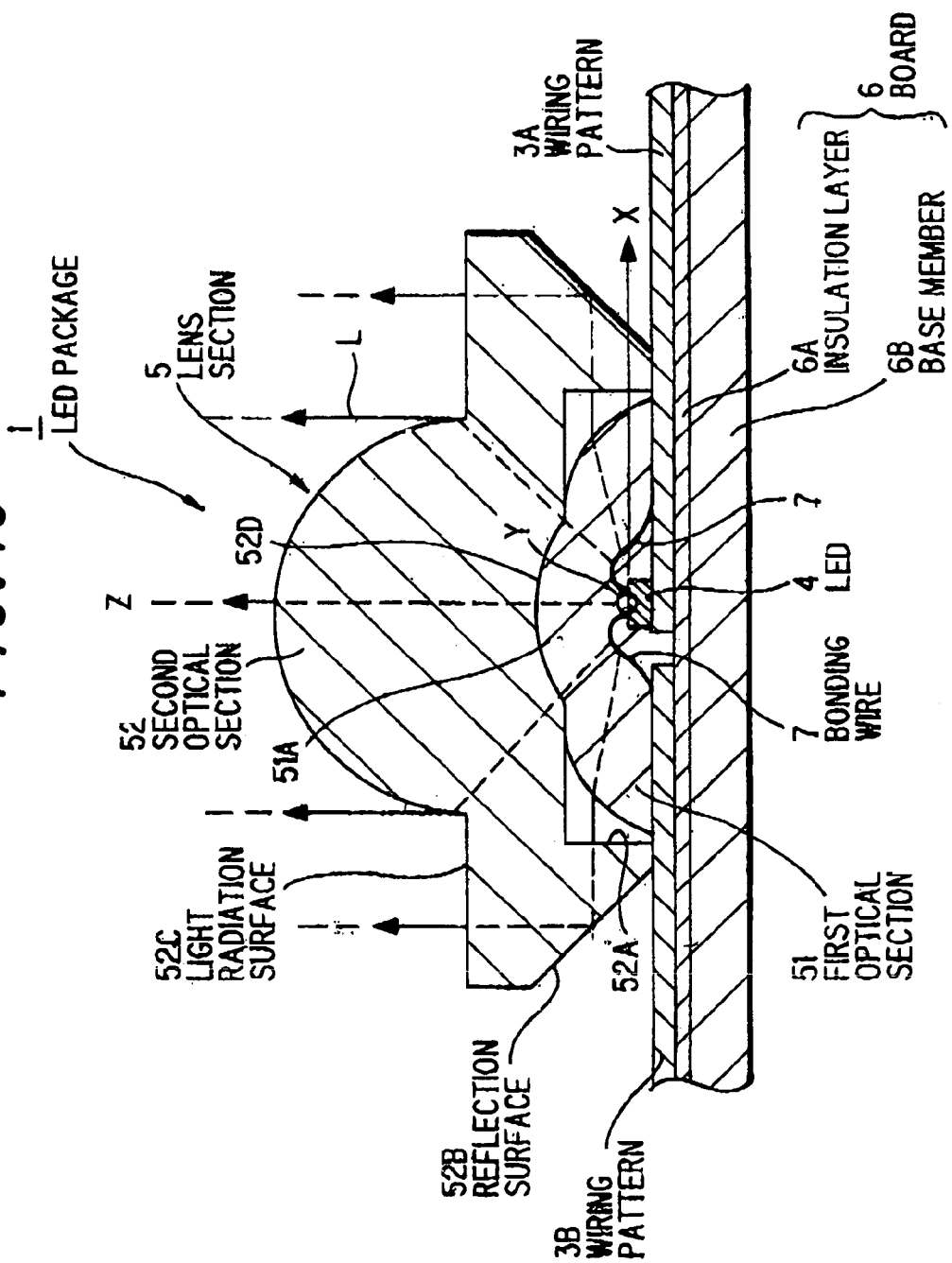
FIG. 10 is a cross sectional view showing an LED package 1 in a ninth preferred embodiment of the invention.

FIG. 10 is a cross sectional view showing an LED package 1 in the ninth preferred embodiment of the invention.

The LED package 1 of this embodiment has, different from that of the seventh embodiment, the first optical section 51 is provided with a radiation surface 51A to be formed spherical based on the origin point of coordinate, the center of light emission surface of LED element 4, and the second optical section 52 is provided with an incident surface 52D shaped along the shape of radiation surface 51A in its opening 52A.

In the ninth embodiment, adding to the effects of the seventh embodiment, light emitted from the LED element 4 in a range of about 35 to 45 degrees can have a reduced interface reflection loss without through an optical adhesive therebetween. Because, incident angles at the interface become nearly perpendicular. It is more desirable that such an optical adhesive is provided therebetween in order to further reduce the interface reflection loss.

[Tenth Embodiment]

Figure 11:
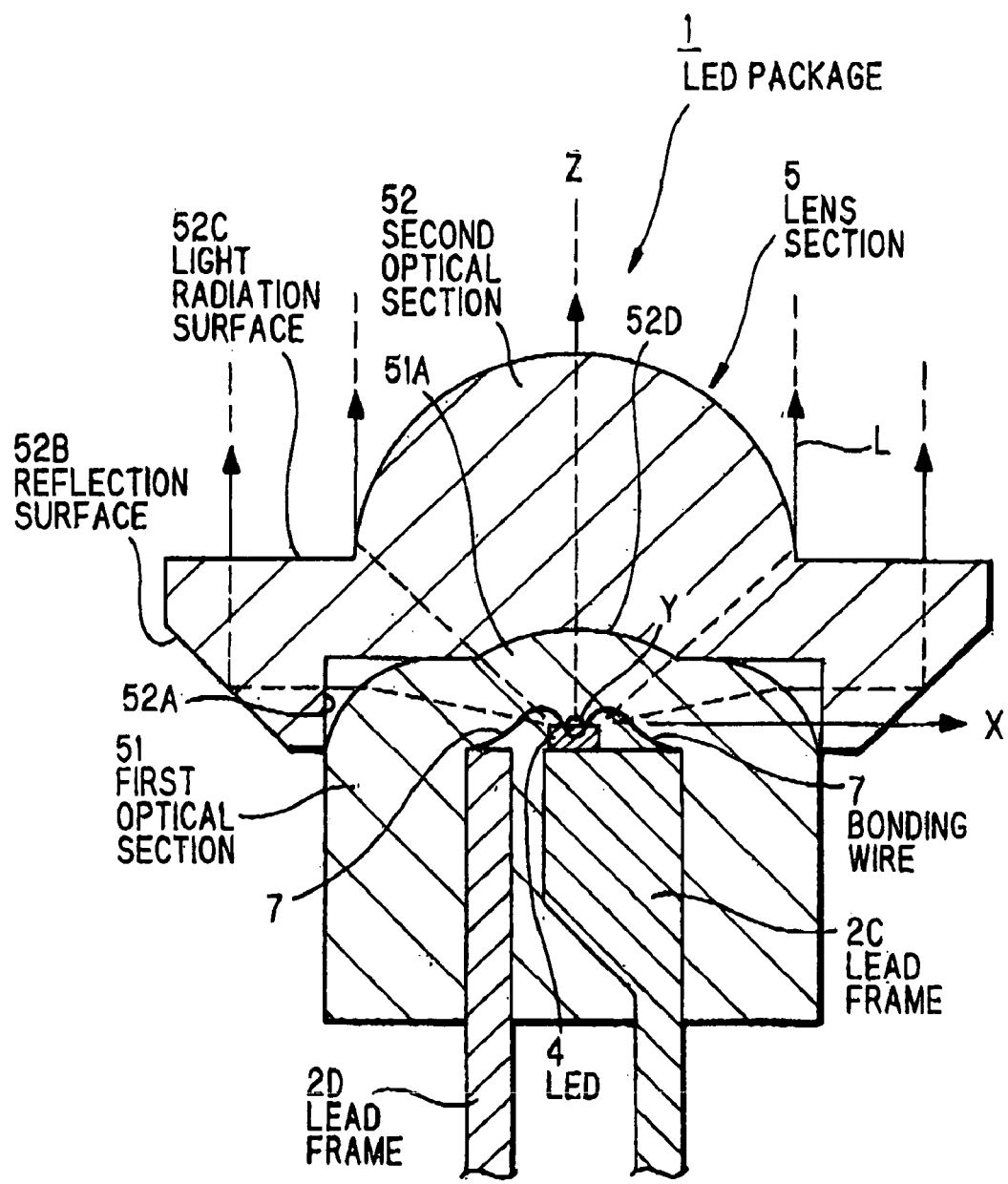
FIG. 11 is a cross sectional view showing an LED package 1 in a tenth preferred embodiment of the invention.

FIG. 11 is a cross sectional view showing an LED package 1 in the tenth preferred embodiment of the invention.

The LED package 1 of this embodiment has, different from that of the ninth embodiment, the LED element 4 being resin-sealed in the first optical section 51 is mounted on lead frame.

The lead frames 2C and 2D are made by punching a metal material such as iron alloy and copper alloy, aluminum with a high thermal conductivity.

In the first optical section 51, the LED element 4 is mounted on the top of lead frame 2C, an electrode (not shown) of LED element 4 is electrically connected through the bonding wire 7 to the lead frame 2C, and these components are integrally sealed using a transparent material such as epoxy resin.

In the tenth embodiment, adding to the effects of the seventh and ninth embodiments, a downsized LED package with a high radiation efficiency can be provided for use of lead-frame-mounted LED package. Further, since the LED element 4 is mounted on the top of lead frame 2C, the resin-sealed area of lead portion can be reduced as compared to that in case of a surface mount type. Therefore, the lowering of reliability caused by thermal stress can be prevented. Furthermore, it can be made by casting mold as a currently mainstream technique and therefore the mass productivity can be enhanced.

[Eleventh Embodiment]

Figure 12:
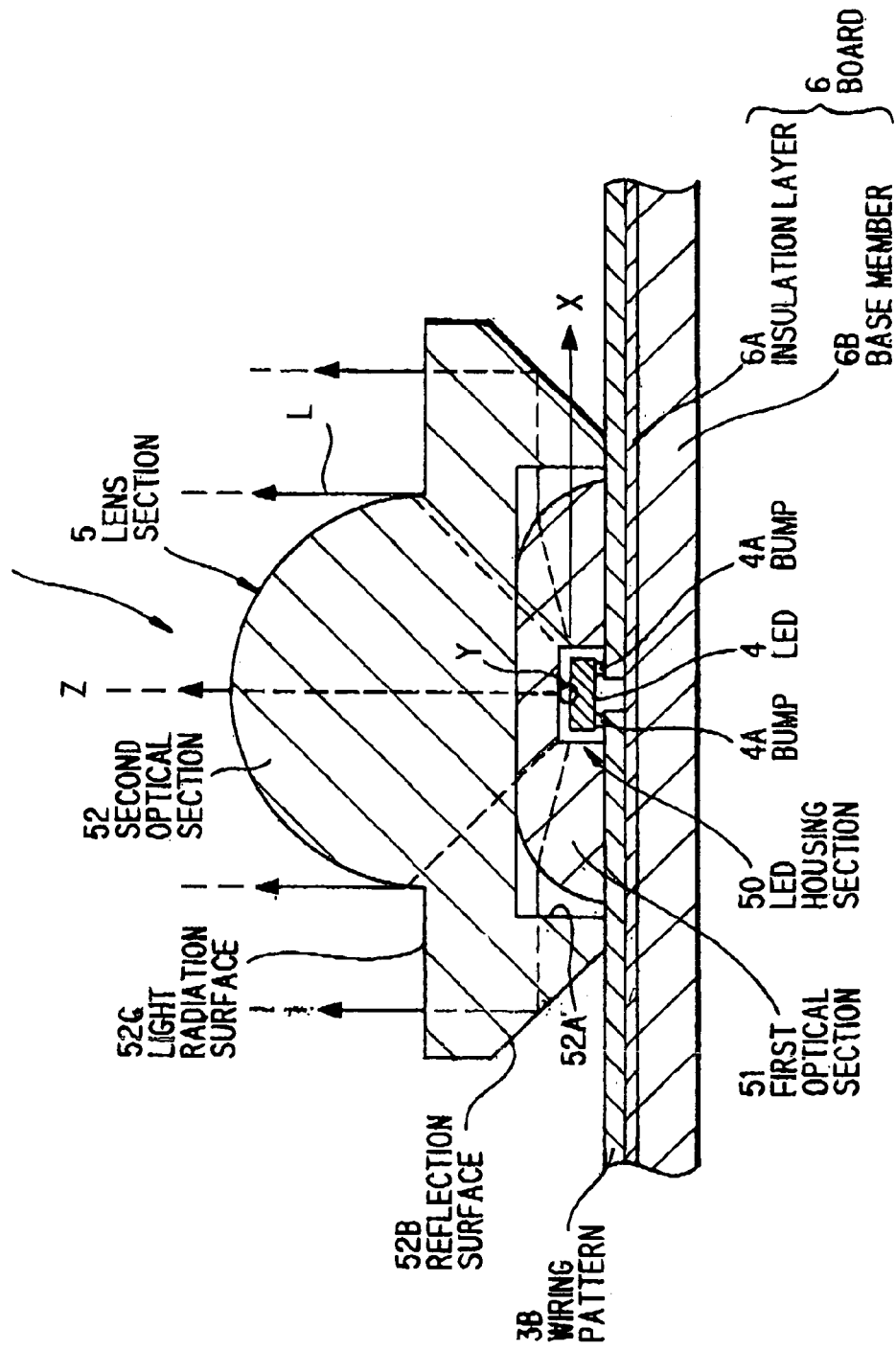
FIG. 12 is a cross sectional view showing an LED package 1 in an eleventh preferred embodiment of the invention.

FIG. 12 is a cross sectional view showing an LED package 1 in the eleventh preferred embodiment of the invention.

The LED package 1 of this embodiment has, different from that of the seventh embodiment, a lens section 5 that is composed of a first optical section 51 that is of transparent resin and has a LED housing section 50 to house the LED element 4 with a gap and bonding wires 7, and a second optical section 52 that is of transparent resin and houses the first optical section 51 at its bottom to radiate light emitted from the LED element 4 in the Z-axis direction based on its convergence and reflection.

The first optical section 51 is made in separate process and is bonded onto the board 6 with the LED element 4 mounted thereon.

In the eleventh embodiment, adding to the effects of the seventh embodiment, the first optical section 51 can be bonded without giving a thermal stress to the LED element 4 and board 6. Thereby, the reliability can be enhanced while offering a good convergence/reflection characteristic in the Z-axis direction.

[Twelfth Embodiment]

FIG. 13 is a cross sectional view showing an LED package 1 in the twelfth preferred embodiment of the invention.

The LED package 1 of this embodiment has, different from that of the first embodiment, a lens section 5 that is composed of a first optical section 51 to radiate refracting light emitted from the LED element 4 in the direction perpendicular to the Z-axis, a second optical section 52 to radiate converging light emitted from the LED element 4 in the Z-axis direction, and a third optical section 53 to radiate light emitted from the LED element 4 in the Z-axis based on total reflection.

The first optical section 51 is provided with a convex surface that allows light emitted from the LED element 4 in a range of about 60 to 90 degrees to the Z-axis to be radiated refracted in the direction perpendicular to the Z-axis.

The second optical section 52 is provided with a convex surface that allows light emitted from the LED element 4 in a range of less than about 35 degrees to the Z-axis to be radiated converged in the Z-axis direction.

The third optical section 53 is provided with a reflection surface 53A to reflect light emitted from the LED element 4 in a range of about 35 to 60 degrees to the Z-axis based on total reflection, and a light radiation surface 53B to radiate the totally-reflected light in the Z-axis direction.

In the twelfth embodiment, adding to the effects of the first embodiment, since the reflection surface 53A to reflect light based on total reflection is provided in a lens region where interface reflection loss is likely to occur, loss of radiation light can be effectively prevented. The convergence performance in the Z-axis direction can be enhanced.

[Thirteenth Embodiment]

Figure 14A:
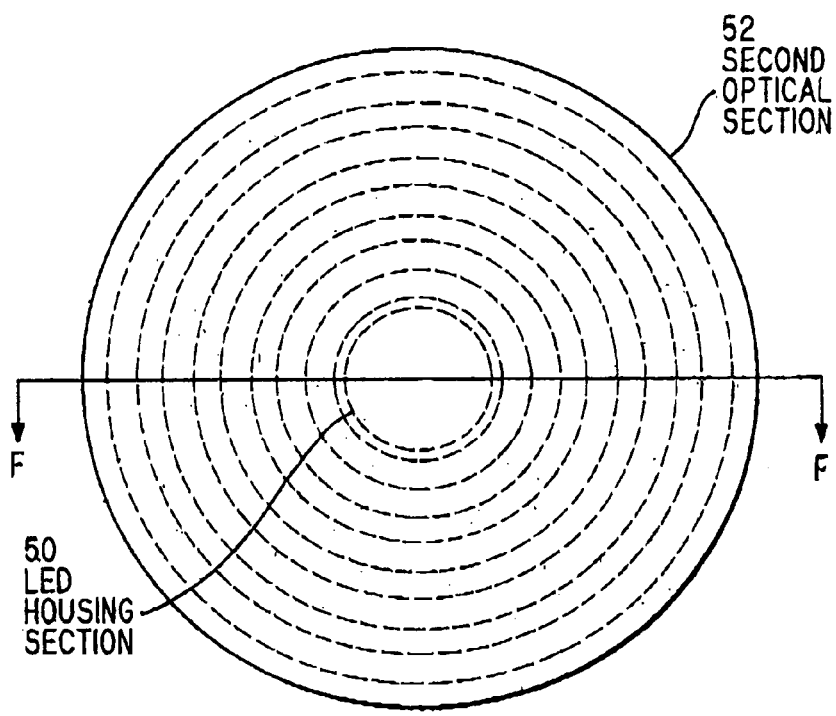
FIG. 14A is a top view showing an LED package 1 in a thirteenth preferred embodiment of the invention.
Figure 14B:
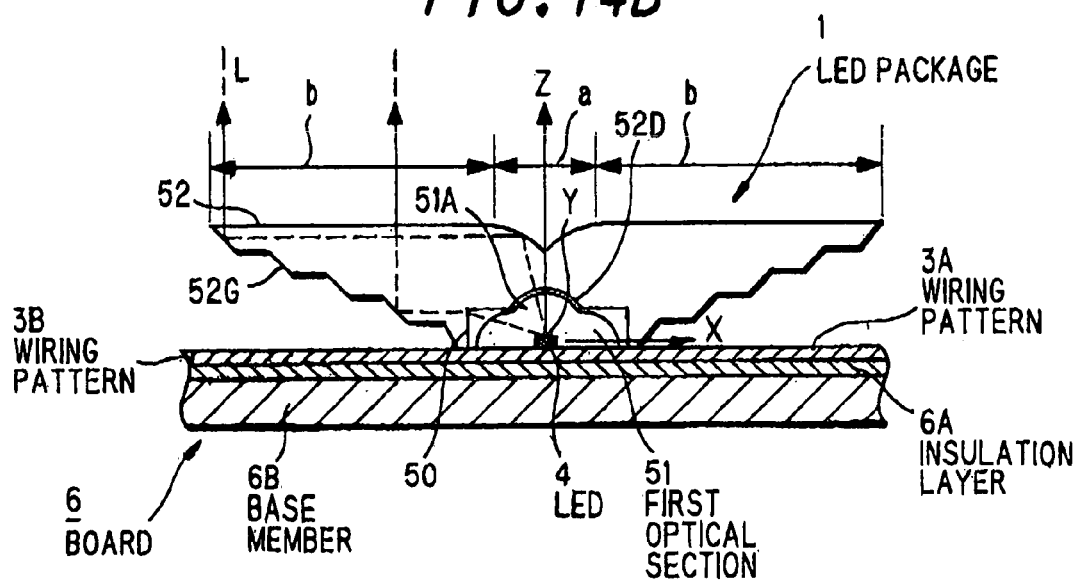
FIG. 14B is a cross sectional view cut along the line F—F in FIG. 14A.

FIG. 14A is a top view showing an LED package 1 in the thirteenth preferred embodiment of the invention. FIG. 14B is a cross sectional view cut along the line F—F in FIG. 14A.

The LED package 1 of this embodiment has, like the eighth embodiment, the first optical section 51 is provided with a radiation surface 51A to be formed spherical based on the origin point of coordinate, the center of light emission surface of LED element 4, and the second optical section 52 is provided with an incident surface 52D shaped along the shape of radiation surface 51A in its opening 52A.

Further, the second optical section 52 has, as shown by cross section in FIG. 14B, provided with a plurality of stepwise circular reflection portions 52G on the bottom side (on the side of board 6). The reflection portions 52G have an inclined angle of 45 degrees. The second optical section 52, as shown in FIG. 14B, has a surface that defines a parabolic cross section in region-a close to the LED element 4 and defines a flat plane in region-b outer than region-a.

Thus, the LED package 1 of this embodiment is structured such that the second optical section 52 has no dome-shaped converging lens on its top as in the first to twelfth embodiments and, instead of this, has the parabolic plane (region-a) to reflect light emitted from the LED element 4 in the direction of the X-Y plane and the reflection portions 52G to reflect such reflected light in the Z-axis direction.

The first optical section 51 is provided with a convex surface that allows light emitted from the LED element 4 in a range of about 60 to 90 degrees to the Z-axis to be radiated refracted in the direction perpendicular to the Z-axis.

In the thirteenth embodiment, since the second optical section 52 has the parabolic plane in region-a close to the LED element 4 and the circular reflection portions 52G, light component emitted near the center axis of LED element 4 can be laterally diffused in the radial direction of second optical section 52. Therefore, the light intensity can be equalized.

[Fourteenth Embodiment]

Figure 15A:
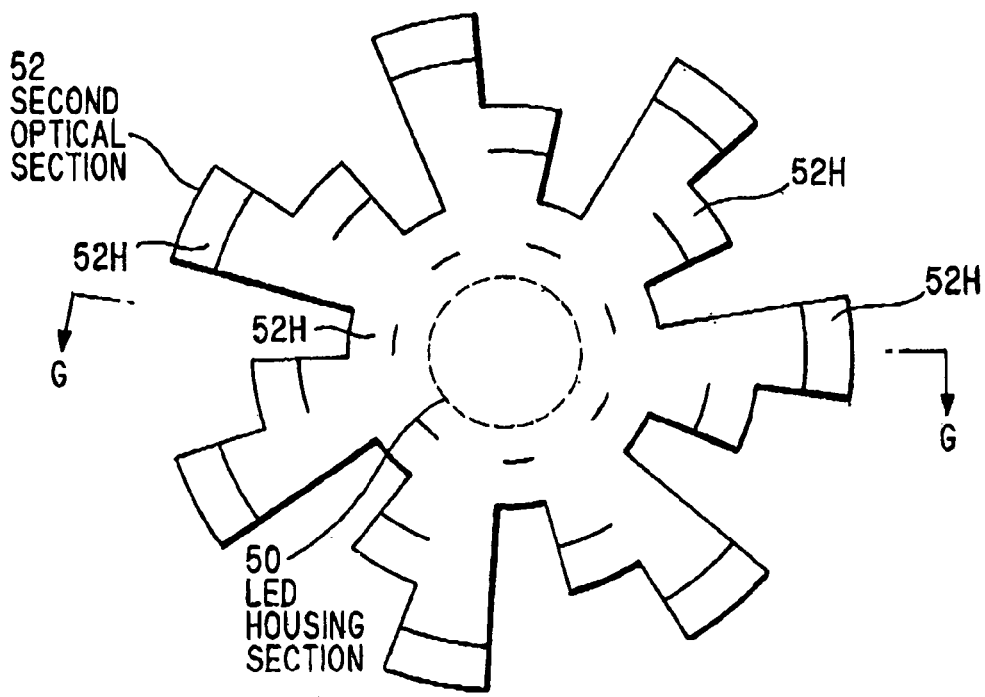
FIG. 15A is a top view showing an LED package 1 in a fourteenth preferred embodiment of the invention.

FIG. 15A is a top view showing an LED package 1 in the fourteenth preferred embodiment of the invention. FIG. 15 is a cross sectional view cut along the line G—G in FIG. 15A.

Figure 15B:
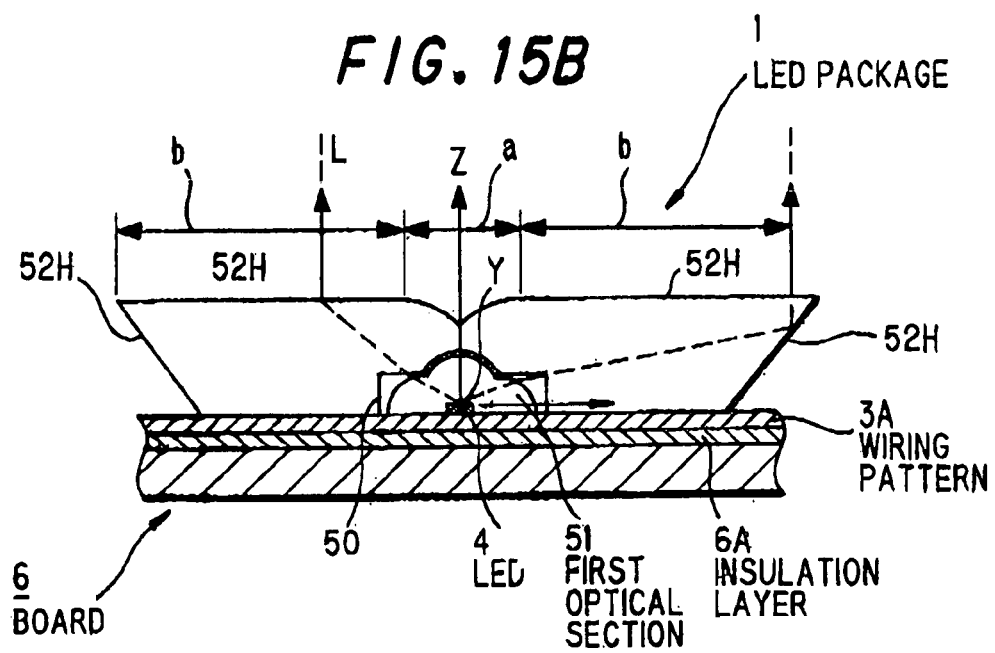
FIG. 15B is a cross sectional view cut along the line G—G in FIG. 15A.

The LED package 1 of this embodiment is, different from the thirteenth embodiment, composed of a second optical section 52 that is provided with three reflection portions 52H, on the bottom side, which are disposed at intervals of predetermined angle (in this embodiment, 360/7 degrees) in the circumference direction and which are disposed at different positions each other in the radial direction. The reflection portions 52H have an inclined angle of 45 degrees. The second optical section 52, as shown in FIG. 15B, has a surface that defines a parabolic cross section in region-a close to the LED element 4 and defines a flat plane in region-b outer than region-a.

In the fourteenth embodiment, since the three reflection portions 52H disposed at different positions in the radial direction are continuously disposed in the circumference direction of second optical section 52, the brightness varies at different positions and thereby it looks glittering. Further, since the optical system 85 has the parabolic plane in region-a close to the LED element 4 and the reflection portions 52H, light component emitted near the center axis of LED element 4 can be laterally diffused in the radial direction of second optical section 52. Therefore, the light intensity can be equalized.

Although in the above embodiments almost all lights emitted from the LED element 4 is radiated parallel to the Z-axis based on convergence or reflection, the radiation direction is not limited to one direction. For example, the LED package 1 of the invention may have an optical surface shape to externally radiate light in a range of within a predetermined angle to the Z-axis or to provide an asymmetrical lighting distribution between the X-axis and Y-axis directions. Also, it may radiate light by controlling the lighting distribution into several directions such as the optical axis Z direction and a direction perpendicular to the Z-axis.

As described above, the invention intends to obtain a high control efficiency or to solve various problems by that light difficult to control or light to cause the various problems in controlling it because of being emitted to an inclined direction (e.g., a direction of greater than 45 degrees to the Z-axis) from the LED element is converged in the direction nearly perpendicular to the Z-axis.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting diode (LED) package, comprising:
  a light emitting element;
  a first optical section that is disposed around the light emitting element; and
  a second optical section that is disposed around the first optical section while being separated from the first optical section;
  wherein a gap is formed between the first and second optical sections, the gap allowing a part of light emitted from the light emitting element to be radiated from the first optical section as nearly parallel light converged in the direction perpendicular to the center axis of the light emitting element, and the second optical section includes a reflection surface to reflect the nearly parallel light in the direction parallel to the center axis of the light emitting element.

2. The LED package according to claim 1, wherein:
  the part of light emitted from the light emitting element is emitted in a range of about 45 to about 90 degrees to the center axis of the light emitting element.

3. The LED package according to claim 1, wherein:
  the first optical section is provided with a recess to house the light emitting element.

4. The LED package according to claim 3, wherein:
  the recess has a phosphor layer formed on its surface.

5. The LED package according to claim 1, wherein:
the first optical section is formed sealing integrally the light emitting element.

6. The LED package according to claim 5, wherein:
the light emitting element is mounted on a lead frame.

7. The LED package according to claim 1, wherein:
the second optical section includes a plurality of the reflection surfaces on its bottom side.

8. The LED package according to claim 7 wherein:
the plurality of the reflection surfaces are formed stepwise in cross section.

9. The LED package according to claim 7 wherein:
the plurality of the reflection surfaces are intermittently formed in the circumference direction of the second optical section.

10. A light emitting diode (LED) package, comprising:
a light emitting element;
a first optical section that is disposed around the light emitting element; and
a second optical section that is disposed around the first optical section, wherein the first and second optical sections are in contact with each other in a region of a range of about 45 degrees or less to the center axis of the light emitting element,
wherein a gap is formed between the first and second optical sections, the gap allowing part of light emitted from the light emitting element to be radiated from the first optical section as nearly parallel light converged in a direction perpendicular to the center axis of the light emitting element, and the second optical section includes a reflection surface to reflect the nearly parallel light in the direction parallel to the center axis of the light emitting element.

11. The LED package according to claim 10, wherein a part of light emitted from the light emitting element is emitted in a range of about 45 to about 90 degrees to the center axis of the light emitting element.

12. The LED package according to claim 10, wherein the first optical section is provided with a recess to house the light emitting element.

13. The LED package according to claim 12, wherein the recess has a phosphor layer formed on its surface.

14. The LED package according to claim 10, wherein the first optical section is formed sealing integrally the light emitting element.

15. The LED package according to claim 14, wherein the light emitting element is mounted on a lead frame.

16. The LED package according to claim 10, wherein the first optical section comprises a first optical portion and a second optical portion, wherein said first optical portion and said second optical portion are in contact with each other in a region of a range of about 45 degrees or less to the center axis of the light emitting element.

17. A light emitting diode (LED) package, comprising:
a light emitting element;
a first optical section that is disposed around the light emitting element; and
a second optical section that encloses the first optical section,
wherein the first and second optical sections are in contact with each other in a region between about 45 degrees or less to the center axis of the light emitting element, and the center axis of the lighting element, and
wherein a gap is formed between the first and second optical sections in a region between about 45 degrees or less to the center axis of the light emitting element, and 90 degrees to the center axis of the lighting element, the gap allowing a part of light emitted from the light emitting element to be radiated from the first optical section as nearly parallel light converged in a direction perpendicular to the center axis of the light emitting element, and the second optical section includes a reflection surface to reflect the nearly parallel light in the direction parallel to the center axis of the light emitting element.

* * * * *